(12) United States Patent
van Meijl et al.

(10) Patent No.: US 11,327,096 B2
(45) Date of Patent: May 10, 2022

(54) VOLTAGE DIVIDER ASSEMBLY

(71) Applicant: 3M INNOVATIVE PROPERTIES COMPANY, St. Paul, MN (US)

(72) Inventors: Hermanus Franciscus Maria van Meijl, Someren-Eind (NL); Michael H. Stalder, Uedem (DE)

(73) Assignee: 3M Innovative Properties Company, St. Paul, MN (US)

(*) Notice: Subject to any disclaimer, the term of this patent is extended or adjusted under 35 U.S.C. 154(b) by 15 days.

(21) Appl. No.: 16/771,950

(22) PCT Filed: Dec. 17, 2018

(86) PCT No.: PCT/IB2018/060205
§ 371 (c)(1),
(2) Date: Jun. 11, 2020

(87) PCT Pub. No.: WO2019/123218
PCT Pub. Date: Jun. 27, 2019

(65) Prior Publication Data
US 2021/0072288 A1    Mar. 11, 2021

(30) Foreign Application Priority Data
Dec. 18, 2017   (EP) .................................. 17208052

(51) Int. Cl.
*G01R 15/06*   (2006.01)
*G01R 15/04*   (2006.01)
(Continued)

(52) U.S. Cl.
CPC ............ *G01R 15/06* (2013.01); *G01R 15/04* (2013.01); *G01R 19/0084* (2013.01); *G01R 31/50* (2020.01)

(58) Field of Classification Search
CPC ........ G01R 15/00; G01R 15/04; G01R 15/06; G01R 19/00; G01R 19/0084; G01R 19/0092; G01R 31/00; G01R 31/50
(Continued)

(56) References Cited

U.S. PATENT DOCUMENTS 11,099,215 B2 *  8/2021  Westkamp ............. G01R 15/06
2007/0141882 A1  6/2007  Stepniak
(Continued)

FOREIGN PATENT DOCUMENTS

DE    29605845     6/1996
EP    0678956      10/1995
(Continued)

OTHER PUBLICATIONS

1507 Extended EP Search Report for E17208052.5, PCT/US2014/039653, dated Jun. 13, 2018, 7 pages.
(Continued)

*Primary Examiner* — Hoai-An D. Nguyen
(74) *Attorney, Agent, or Firm* — Gregg H. Rosenblatt

(57) ABSTRACT

A voltage divider assembly for a voltage-dividing sensor for sensing a voltage of a MV/HV power conductor in a power network includes a plurality of discrete impedance elements electrically connected in series with each other such as to be operable as a high-voltage cable side of the voltage-dividing sensor and a cable connector for mechanical engagement with a cable plug at an end of a tap cable conducting the voltage of the power conductor to the voltage divider assembly. The cable connector is electrically connected with one discrete impedance element of the plurality of discrete impedance elements.

16 Claims, 4 Drawing Sheets

Figure 1:
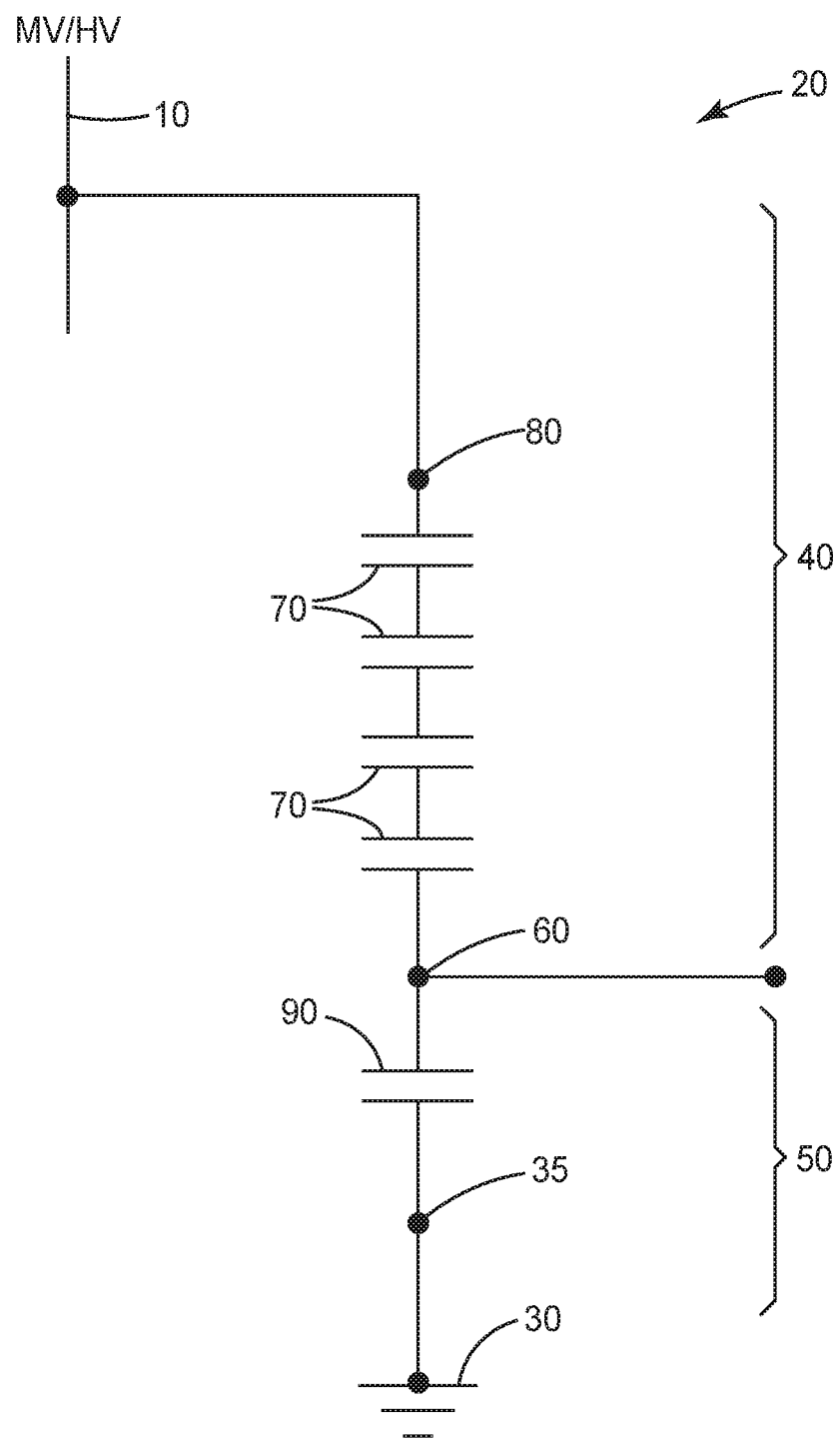

(51) Int. Cl.
*G01R 19/00* (2006.01)
*G01R 31/50* (2020.01)

(58) Field of Classification Search
USPC .... 324/76.11, 126, 600, 649, 691, 713, 522; 702/1, 57, 64
See application file for complete search history.

(56) References Cited

U.S. PATENT DOCUMENTS

| | | |
|---|---|---|
| 2016/0061862 A1 | 3/2016 | Nulty |
| 2019/0086444 A1* | 3/2019 | Gravermann .......... H05K 1/189 |
| 2020/0278382 A1* | 9/2020 | Weichold ............... G01R 31/58 |

FOREIGN PATENT DOCUMENTS

| | | |
|---|---|---|
| EP | 2819250 | 12/2014 |
| EP | 2887074 | 6/2015 |
| EP | 2950107 | 12/2015 |
| EP | 3223024 | 9/2017 |
| WO | 2010-128385 | 11/2010 |
| WO | 2014-209739 | 12/2014 |
| WO | 2017-164952 | 9/2017 |

OTHER PUBLICATIONS

International Search report for PCT International Application No. PCT/IB2018/060205 dated Apr. 4, 2019, 5 pages.

* cited by examiner

VOLTAGE DIVIDER ASSEMBLY

The invention relates to voltage dividers that can be operated in voltage-dividing sensors for sensing a voltage of a power conductor in medium-voltage or high-voltage power networks of national grids. In particular, it relates to such voltage dividers that can be engaged with an end of a cable.

In order to be able to better exploit the capabilities of large-area electrical power distribution networks ("smart grids"), voltage sensors can be placed in power distribution devices, e.g. switchgears, of the network. Measuring the voltage of the power conductors of a network at switchgears with an adequate precision enables closer monitoring and automated control of the network.

Most traditional voltage dividers are installed close to the power conductor, the voltage of which is to be determined, such as the voltage divider in the voltage sensing system described in the international patent application WO 2010/128385 A1, which provides an opening to allow for passage of the conductor therethrough.

Other known voltage dividers are installed on, or close to, functional elements conducting the power, like switches, e.g. in switchgears, cable connectors or terminations at cable ends. An example is the voltage sensor in the European patent application EP 0 678 956 A1, installed on a bottom wall of a switchgear compartment, in which a voltage sensor is located next to the electrical current path through the device.

Where space in the vicinity of the power conductor is scarce or difficult to access, or where an existing power network may be provided with voltage sensing capabilities retroactively, it may be desirable that a voltage-dividing sensor can be installed at a location remote from the power conductor. It may also be desirable that a voltage sensor can be installed without having to disconnect or even to cut the existing power conductor, e.g. a power cable.

In an attempt to address this need, the present disclosure provides a voltage divider assembly, operable in a voltage-dividing sensor for sensing a voltage of a MV/HV power conductor in a power network of a national grid, the voltage divider assembly comprising
   a) a plurality of discrete impedance elements, electrically connected in series with each other such as to be operable as a cable side of the voltage-dividing sensor;
   b) a cable connector for mechanical engagement with a cable plug at an end of a tap cable conducting the voltage of the power conductor to the voltage divider assembly,
   wherein the cable connector comprises a conductive portion, electrically connected with one discrete impedance element of the plurality of discrete impedance elements, and electrically connectable to the cable plug by engagement of the cable plug with the cable connector.

A voltage divider assembly according to the present disclosure can be used to sense a high voltage remote from the power conductor, because it comprises a cable connector for connection to a tap cable which leads the voltage of the power conductor over a certain distance to the voltage divider assembly.

The voltage divider assembly can be installed in locations close to elements on electrical ground, because the plurality of discrete impedance elements can provide for a smooth voltage gradient from network voltage of the power conductor at the high-voltage end of the divider assembly to a much lower signal voltage or even to ground at the low-voltage end of the voltage divider assembly.

The term "medium voltage" (or "MV") as used herein refers to a voltage in the range of about 1 kV (kilovolt) to about 72 kV versus ground. "High voltage" or "HV" refers to a voltage above about 72 kV versus ground. The term "MV/HV" is used herein as an abbreviation for "medium-voltage or high-voltage".

In the context of the present disclosure, the term "power conductor" refers to an element that is designed to conduct electrical power at voltages above 1 kV versus ground with currents above 10 ampere in power networks of national grids. In certain embodiments a power conductor is the central conductor of a MV or HV power cable. In certain embodiments a power conductor is one of a plurality of conductors of a multi-core MV or HV power cable. In other embodiments a power conductor is a bus bar, such as a—hollow or solid—bus bar conducting electrical power from one location to another location, e.g. within a switchgear.

The expression "network voltage" refers to the voltage of the MV/HV power conductor when in use. Where the power conductor is on an alternating voltage ("AC"), the network voltage also refers to the momentary voltage of the power conductor.

The term "signal voltage" is used herein for the divided voltage which can be picked up between the cable side and the ground side of a voltage divider. Where the dividing ratio of the voltage divider is known, the signal voltage versus ground is proportional to the network voltage versus ground, the proportionality constant being the dividing ratio. The dividing ratio is the ratio of the impedance of the cable side and the impedance of the ground side of the voltage divider.

A voltage-dividing sensor, in the context of the present disclosure, is a voltage sensor for sensing a voltage, e.g. of a MV/HV power conductor, versus ground which uses a voltage divider for sensing the voltage. The voltage-dividing sensor may thus comprise a voltage divider assembly. The voltage divider assembly may comprise the voltage divider or the cable side of the voltage divider.

The voltage divider may divide the network voltage via the plurality of discrete impedance elements, connected in series with each other. For dividing the network voltage, one or more of the plurality of discrete impedance elements are electrically connectable to the power conductor via the tap cable and together form a cable side of the voltage divider. In the voltage divider, one or more second discrete impedance elements are connected between the cable side of the voltage divider and electrical ground and together form a ground side of the voltage divider. The cable side and the ground side of the voltage divider are thus connected electrically in series between the network voltage of the power conductor and electrical ground.

When referring to sides of a voltage divider herein, the term "cable side" refers to the elements of the voltage divider that, when in use, are to be electrically connected to the MV/HV power conductor via the tap cable, and are then arranged electrically between the power conductor and a signal contact of the voltage divider. The signal contact is a contact of the voltage divider where a divided voltage, the "signal voltage", can be picked up. The signal contact is electrically located between the cable side and the ground side of the voltage divider. Generally, the impedances of the discrete impedance elements of the voltage divider assembly forming the cable side, and the impedances of impedance elements forming the ground side of the voltage divider of the voltage-dividing sensor are chosen such that the signal voltage is lower than 100 V, for a given network voltage. Voltages below 100 V can be handled by some commercially available electronic circuitry and present a reduced safety risk.

The term "ground side" refers to those elements of the voltage divider that, when in use, are to be electrically connected to electrical ground or, generally, to a reduced voltage, i.e. a voltage of 100 V or less, and which are then arranged electrically between the reduced voltage contact (or ground) and the signal contact of the voltage divider.

A voltage divider assembly according to the present disclosure may comprise the cable side of a voltage divider and not comprise the ground side of the voltage divider. Alternatively, the voltage divider assembly according to the present disclosure may comprise the cable side and the ground side of the voltage divider. In either case, the voltage divider assembly may comprise a signal contact, electrically arranged between the cable side and the ground side of the voltage divider, for picking up a divided voltage, namely a signal voltage, indicative of the voltage of the power conductor versus ground. Alternatively, the signal contact may not be comprised in the voltage divider assembly. The signal contact may be accessible from an outside of the voltage divider assembly, for example in order to connect a signal wire therewith.

In a voltage divider assembly according to the present disclosure, the (high-voltage) cable side of the voltage divider may be formed by multiple discrete impedance elements electrically connected in series. The same applies to the (low-voltage) ground side of the voltage divider. In certain voltage dividers of a voltage divider assembly according to the present disclosure, the cable side is formed by one or more discrete capacitors. In certain voltage dividers, the cable side is formed by one or more discrete resistors. In certain voltage dividers, the cable side is formed by one or more discrete inductances. In certain voltage dividers, the ground side is formed by one or more discrete capacitors. In certain voltage dividers, the ground side is formed by one or more discrete resistors. In certain voltage dividers, the ground side is formed by one or more discrete inductances. The cable side or the ground side or both sides of a voltage divider in a voltage divider assembly according to the present disclosure may be formed by a combination of any number of discrete capacitors, any number of discrete resistors, and any number of discrete inductances.

The plurality of discrete impedance elements is electrically connected in series with each other. In other words, the plurality of discrete impedance elements may form an electrical chain of discrete impedance elements. In that chain, each impedance element (except those impedance elements at the ends of the chain, referred to as "chain-terminating impedance elements") is electrically connected between two neighbouring impedance elements. This chain of discrete impedance elements is operable as a cable side of a voltage-dividing sensor for sensing a voltage of the power conductor. The plurality of discrete impedance elements, electrically arranged between the network voltage of the power conductor and ground, or between the network voltage of the power conductor and a reduced voltage of less than 100 V, can divide the network voltage of the power conductor. As is commonly known for voltage dividers, the divided voltage is proportional to the voltage of the power conductor, so that knowledge of the proportionality factor and a measurement of the divided voltage allows for determination of the voltage of the power conductor.

The voltage divider assembly according to the present disclosure may comprise further impedance elements, discrete or integrated, which are electrically connected parallel with each other and/or in parallel with one or more of the discrete impedance elements electrically connected in series with each other. For example, a first discrete capacitor may be connected in series with a second discrete capacitor, and also be connected in parallel with a third discrete capacitor, so that the capacitances of the first and of the third capacitors combine to form a larger capacitance.

A so-called tap cable conducts the voltage of the power conductor to the voltage divider assembly described herein. The tap cable is electrically connected, at one of its ends referred to herein as the "network voltage end", to the power conductor. This connection can be a direct connection, in which the network voltage end is in mechanical contact with the power conductor, or an indirect connection, in which the network voltage end is in mechanical contact with an electrically conductive intermediate structure which in turn is in mechanical contact with the power conductor, so that the voltage of the power conductor is conducted through the intermediate structure and the tap cable to the voltage divider assembly where it is divided and sensed.

While the power conductor carries the electrical power and high currents, the tap cable is for conducting voltage, but only the very small current that flows through the voltage divider to ground. For a high-precision measurement of the voltage of the power conductor, however, it is important that the impedance of the tap cable is low enough to avoid a noticeable voltage drop across the length of the tap cable. The cross section of the tap cable's conductor can therefore be small compared to the cross section of the power conductor, but large enough for a voltage drop being negligible. A suitable cross section of the tap cable conductor may be, for example 0.75 mm$^2$ or greater, e.g. 1 mm$^2$. For the same reason, the conductor of the tap cable will also normally consist of a highly conductive material such as copper.

The tap cable and the power conductor are on the same high voltage, namely on the network voltage. In order to reduce the risk of electrical discharge from any portion of the tap cable to an adjacent element on lower voltage or on ground, the tap cable is normally an insulated cable, in which a central conductor is surrounded by a main insulation layer. A suitable main insulation layer may, for example, be made of XLPE (Cross-Linked Polyethylene). A suitable main insulation layer may have a thickness of 6 mm or more. The thickness will generally depend on the material and on the network voltage.

The tap cable will mostly be a flexible cable, that can be bent easily to adopt different shapes. The more flexible the tap cable is, the easier it is to route it, possibly around small-radius corners, from the power conductor to the voltage divider assembly.

The length of the tap cable is not particularly limited and will depend on the geometric distance between the voltage divider assembly and the closest portion of the power conductor. In order to minimize a voltage drop across the length of the tap cable, its length will normally be chosen to be as short as possible.

At its opposite end (the "divider end") the tap cable is to be connected to the voltage divider assembly of the present disclosure. For a reliable and low-impedance connection, the voltage divider assembly has a cable connector, and the tap cable has a matching cable plug at its divider end. A cable plug is a conductive element that is, or can be, secured to the conductor of the tap cable at the divider end of the tap cable. A cable plug comprises mechanical engagement means that are tailored for mechanical engagement with a corresponding, matching, tailored cable connector. By virtue of these engagement means, the cable plug is designed for mechanical engagement with a specific, matching type of cable connector. The cable connector may have corresponding engagement means tailored for mechanical engagement with this specific, matching type of cable plug.

Generally, a cable connector is a conductive element that comprises mechanical engagement means that are tailored for enabling mechanical engagement with a corresponding, matching, tailored cable plug. By virtue of these engagement means, the cable connector is thus designed for mechanical engagement with a specific, matching type of cable plug, which itself has corresponding engagement means tailored for mechanical engagement with this specific, matching type of cable connector. Once engaged with each other, the cable connector and the cable plug are electrically connected with each other, and voltage can be conducted from the cable plug to the cable connector and from the cable connector to the cable plug.

The voltage divider assembly of the present disclosure comprises a cable connector for engagement with the cable plug of the tap cable. The cable connector comprises at least a conductive portion which is electrically connected with one discrete impedance element of the plurality of discrete impedance elements. When engaged, this conductive portion is also electrically connected to the cable plug of the tap cable, either directly, or indirectly via an intermediate conductive element.

Once the tap cable is connected to the power conductor, on its network voltage end, and to the voltage divider assembly, on its divider end, the voltage of the power conductor is conducted via the tap cable, its cable plug and the cable connector of the voltage divider assembly to the voltage divider assembly, where it is divided by the plurality of discrete impedance elements and sensed by the voltage-dividing sensor comprising the plurality of discrete impedance elements as a cable side of its voltage divider.

The geometric shape of a voltage divider assembly according to the present disclosure is not particularly limited. In certain preferred embodiments, however, the voltage divider assembly has an elongate shape defining a length direction of the voltage divider assembly, wherein the plurality of discrete impedance elements is arranged linearly in a straight row defining a long direction, wherein the long direction of the row is parallel, within an angle of +/−15°, to the length direction of the voltage divider assembly. An elongate shape of the voltage divider assembly may be, for example, a shape having short extensions in two dimensions and a long extension in the third dimension, where the aspect ratio of the long extension to any one of the short extensions is 2:1, 3:1, 10:1 or greater.

The voltage of the power conductor is divided down from kilovolts to a lower voltage, e.g. of 100 volt or lower, by the serially connected impedance elements. The more distant a discrete impedance element is electrically from the high voltage, the lower is its voltage. Discrete impedance elements at voltages much lower than the voltage of the power conductor are thus potential targets for electrical discharges originating from the cable connector, which is on the high voltage of the power conductor. An arrangement in which lower-voltage impedance elements are arranged further from the cable connector reduces the risk of electrical discharge between the cable connector (or those impedance elements on higher voltage) and those lower-voltage impedance elements. A linear arrangement of the discrete impedance elements from higher voltage to lower voltage provides that lower-voltage impedance elements can be located further away from the high voltage of the cable connector. An elongate shape of the voltage divider assembly as a whole provides that the desirable linear arrangement of the plurality of discrete impedance elements can be easily accommodated in the voltage divider assembly.

A linear straight row of discrete impedance elements uses the elongate shape of the voltage divider assembly best if it is oriented parallel to the length direction of the voltage divider assembly. It is considered that a deviation by an angle up to 15° on either side is still a good use of the elongate shape of the divider assembly, and that the corresponding slightly higher risk of discharge might be acceptable.

The shape of the voltage divider assembly is not limited to essentially one-dimensional (i.e. straight linear) shapes or two-dimensional shapes such as elongate shapes with a curvature in one direction. Three-dimensional shapes may be suitable to provide adequate distances between discrete impedance elements of the voltage divider assembly, and between the cable connector and the discrete impedance elements. Hence in certain embodiments the voltage divider assembly has a three-dimensional shape, e.g. a linear three-dimensional shape, such as a spiral shape or a helical shape or a corkscrew shape.

A desirable greater distance of discrete impedance elements on lower voltage from the cable connector can be achieved if the voltage divider assembly has an elongate shape and the cable connector is arranged at one end of the elongate voltage divider assembly. Hence, in certain preferred embodiments of the present disclosure, the voltage divider assembly has an elongate shape defining a length direction of the voltage divider assembly, a first end portion, an opposed second end portion and a middle portion, connecting the first end portion with the second end portion of the voltage divider assembly, wherein the cable connector is arranged at the first end portion.

In certain of these embodiments, the middle portion comprises the plurality of discrete impedance elements. This arrangement may be particularly space-saving.

In embodiments in which the voltage divider assembly has an elongate shape defining a length direction of the voltage divider assembly, a first end portion, an opposed second end portion and a middle portion, connecting the first with the second end portion of the voltage divider assembly, the first end portion (i.e. a wire, a contact or a discrete impedance element arranged at the first end portion) may be electrically connected to the high voltage of the power conductor, and the second end portion (i.e. a wire, a contact or a discrete impedance element arranged at the second end portion) may be connected to lower voltage or electrical ground. Generally, with a smaller geometrical distance between the end portions, the risk of electrical discharges between the opposed end portions is generally higher. It is therefore desirable that the voltage divider assembly has a certain geometrical extension between its end portions, i.e. a certain geometrical length. For MV/HV equipment and the voltages present in such equipment, the length may be 10 cm or greater, 15 cm or greater, or 20 cm or greater. Generally, in certain embodiments in which the voltage divider assembly has an elongate shape defining a length direction of the voltage divider assembly, a first end portion, an opposed second end portion and a middle portion, connecting the first and second end portions, the geometric extension of the voltage divider assembly, measured linearly between its opposed end portions and including the end portions, is 10 cm or greater, 15 cm or greater, or 20 cm or greater. The geometric extension is determined by a straight line between the end portions, not by following the contour of the voltage divider assembly.

The discrete impedance elements may be connected with each other in a self-supporting way, e.g. by a wire. For greater mechanical robustness, however, the impedance elements may be mounted on a rigid or flexible substrate. In certain preferred embodiments, the plurality of discrete impedance elements is arranged on a printed circuit board ("PCB"). The PCB may comprise conductive paths for electrically connecting discrete impedance elements with each other. The PCB may comprise a conductive path for electrically connecting the plurality of discrete impedance elements with the cable connector or with the conductive portion of the cable connector.

In order to be operated as a cable side of the voltage-dividing sensor, one end of the voltage-dividing chain of serially connected discrete impedance elements must be electrically connected with the power conductor. This connection is established via the conductive portion of the cable connector. The plurality of discrete impedance elements is therefore electrically connected with the conductive portion of the cable connector. Specifically, one of the chain-terminating impedance elements may be connected to the conductive portion of the cable connector. In use, this conductive portion, in turn, is electrically connected to the tap cable and, via the tap cable, to the power conductor and hence to the high voltage of the power conductor.

More specifically, one discrete impedance element (namely one of the chain-terminating impedance elements) of the plurality of discrete impedance elements may be electrically connected with the conductive portion of the cable connector. This one chain-terminating impedance element may be the impedance element electrically arranged at the first end portion of an elongate voltage divider assembly. This one impedance element may pick up the high voltage from the tap cable, so that the high voltage of the power conductor can be divided by the plurality of discrete impedance elements.

In certain embodiments, the cable connector is attached to the printed circuit board. This attachment may be done, for example, adhesively or by screws, soldering or welding. The cable connector may be attached to the printed circuit board directly, i.e. the two elements contacting each other. An attachment, i.e. a mechanical attachment, of the cable connector to the PCB may provide for an enhanced mechanical stability of the voltage divider assembly and may facilitate electrical connection of the cable connector to one of the discrete impedance elements.

The voltage divider assembly as described herein is electrically connected between the medium or high voltage of the power conductor and a lower voltage, e.g. a ground voltage. Any steep voltage gradient along the voltage divider assembly may result in an increased risk of electrical discharge between a portion of the voltage divider assembly on higher voltage and a portion on lower voltage. If, for example, a single impedance element were used to divide the high voltage of the power conductor, a discharge across the impedance element were likely to occur. For a less steep, smoother voltage gradient between the ends of the chain of impedance elements, it is normally desirable that the plurality of discrete impedance elements comprise three or more, five or more, preferably ten or more, or fifteen or more discrete impedance elements. Since in these scenarios the voltage drop across each of these impedance elements is smaller, compared to a scenario with less impedance elements, the risk of an electrical discharge across any one of the impedance elements is reduced. Therefore, in certain preferred embodiments, the plurality of discrete impedance elements comprises ten or more, or fifteen or more, discrete impedance elements.

In certain embodiments, each discrete impedance element of the plurality of discrete impedance elements has a nominal voltage rating of at least 3 kV. In other words, each discrete impedance element is designed to be operated at a voltage of at least 3 kV between its contacts. This may help in obtaining voltage divider assemblies of a smaller geometric size.

In certain embodiments, all discrete impedance elements of the plurality of discrete impedance elements have an identical nominal impedance. This may ensure a smooth and even voltage drop along the length of the voltage divider assembly, and may allow for more cost-effective production.

After the cable connector of a voltage divider assembly according to the present disclosure has been engaged with a cable plug of a tap cable, it may be found necessary to remove the voltage divider assembly or to remove the tap cable, e.g. for replacement, repair or maintenance of the tap cable or of the voltage divider assembly. It may therefore be desirable that the voltage divider assembly can be released from the tap cable with which it has been previously engaged. Such a releasability may also be desirable when a voltage divider assembly is supposed to be removed from one tap cable in order to be installed on another tap cable. Therefore, in certain embodiments, the cable connector is adapted for releasable mechanical engagement with a cable plug at an end of a tap cable conducting the voltage of the power conductor to the voltage divider assembly. The cable connector may be adapted to connect the voltage divider assembly to a cable plug of the tap cable manually releasably, i.e. without a need to use tools. A releasable connection may be obtained by the cable connector comprising, for example, a spring, a clamp, a clip, a latch, a thread, a screw, a thread, a threaded hole, or a bolt, for releasable engagement with a cable plug. In certain embodiments the cable connector has the shape of a top end connector of a commercially available automotive spark plug. In certain embodiments the cable connector has a suitable shape to be engageable with a commercially available automotive spark plug cable, such as the spark plug cable available from Robert Bosch GmbH having the article number 0 986 356 338, usable for certain Volkswagen and Seat vehicles. The high or medium voltage of the power conductor is divided by the plurality of discrete impedance elements, which are operable as a cable side of voltage divider in a voltage-dividing sensor for sensing the voltage of the power conductor. Thereby, this divided voltage is indicative of the voltage of the power conductor. In an aspect of the present disclosure, the voltage divided by the plurality of discrete impedance elements may be made available for measurement, e.g. for measurement outside the voltage divider assembly. A wire may be employed to pick up the divided voltage at one of its ends and make it available at its other end for measurement. Since the divided voltage is the signal desired for sensing the voltage of the power conductor, this wire may be referred to as a "signal wire". Where the voltage divider assembly comprises a signal contact as described above, the signal wire may be connected, at one end, to the signal contact and pick up the divided voltage at the signal contact. Since the signal contact is electrically connected to an impedance element of the plurality of discrete impedance elements, the signal wire may be electrically connected to an impedance element of the plurality of discrete impedance elements.

Thus, in preferred embodiments of the present disclosure, the voltage divider assembly further comprises a signal wire for making a voltage divided by the plurality of discrete impedance elements, and indicative of the voltage of the power conductor, available for measurement outside the voltage divider assembly.

Where the plurality of discrete impedance elements is embedded in a solid, electrically insulating encapsulation body, as described below, the signal wire described above may lead from the signal contact through the encapsulation body to an outside of the encapsulation body. In such embodiments, the voltage divider assembly thus comprises a signal wire for making a voltage divided by the plurality of discrete impedance elements, and indicative of the voltage of the power conductor, available for measurement outside the encapsulation body.

For lower voltages of the MV/HV power conductor and under specific conditions, e.g. in an environment of insulating gas or liquid, and/or in benign environments, a voltage divider assembly according to the present disclosure may be usable without further insulation. However, and independent of the shape of the voltage divider assembly, it may be desirable to protect the plurality of discrete impedance elements, or some of the discrete impedance elements of the plurality, against environmental effects and mechanical or electrical impacts during assembly, installation and use. Therefore, in certain embodiments, the plurality of discrete impedance elements is embedded in a solid, electrically insulating encapsulation body. Such an encapsulation body may also reduce the risk of electrical discharges between discrete impedance elements on different voltages and between one of the discrete impedance elements and a component on electrical ground, e.g. a grounded component of a switchgear in which the voltage divider assembly may be mounted. Due to the encapsulation body, the voltage divider assembly can be installed closer to a grounded component.

In some of these embodiments, the plurality of discrete impedance elements is embedded in a solid, electrically insulating encapsulation body which contacts all exposed surfaces of the discrete impedance elements. Such an encapsulation body may help in reducing the number of air pockets in it or avoid such air pockets. This in turn may reduce the risk of discharges within the encapsulating body.

The encapsulation body may be made from, or comprise, an electrically insulating casting resin, e.g. an epoxy resin. A resin material usable for making an encapsulation body of a voltage divider assembly as described herein is the "Scotchcast™" series of casting resins available from 3M. The resin may initially be liquid when cast around the discrete impedance elements, and later harden, e.g. by curing. In certain embodiments the encapsulation body is transparent, thereby allowing visual inspection of the impedance elements. In other embodiments, the encapsulation body is opaque, thereby concealing the impedance elements from undesired views. The encapsulation body may be rigid, and thereby increase the mechanical stability of the voltage divider assembly. For enhanced protection, the entire voltage divider assembly may be embedded in a solid, electrically insulating encapsulation body. The encapsulation body may be made from, or comprise, an epoxy resin providing a dielectric strength of 10 kV/mm or higher.

Where the voltage divider assembly has an elongate shape defining a length direction of the voltage divider assembly, a first end portion, an opposed second end portion and a middle portion, connecting the first and second end portions, of the voltage divider assembly, and wherein the plurality of discrete impedance elements is arranged in the middle portion, the middle portion may be embedded in a solid, electrically insulating encapsulation body. In some embodiments, the first end portion, the second end portion and the middle portion are embedded in a solid, electrically insulating encapsulation body.

The solid encapsulation body may be useful for providing mechanical stability, e.g. rigidity, to the voltage divider assembly. It may also be used to hold the cable connector in a fixed spatial relation, i.e. position and orientation, relative to the plurality of discrete impedance elements and, if existent, relative to a PCB on which the discrete impedance elements are mounted. This can be achieved particularly easily and cost-effectively by embedding a portion of the cable connector in the encapsulation body, or, in other words, by the encapsulating body encapsulating a portion of the cable connector. The portion of the cable connector which facilitates engagement with the cable plug of a tap cable should obviously remain accessible, i.e. not embedded or encapsulated.

Hence, in certain embodiments of the voltage divider assembly according to the present disclosure, the encapsulation body encapsulates a first portion of the cable connector, and leaves a second portion of the cable connector accessible for engagement with a cable plug of a tap cable.

It may be desirable to protect the cable connector against mechanical impact, e.g. during transport or during installation of the voltage divider assembly. Where the cable connector is partially encapsulated or embedded in an encapsulation body, it may be desirable to protect its accessible portion. The encapsulation body may be appropriately shaped to protect the cable connector. Therefore, in certain embodiments, the encapsulation body comprises a wall portion forming a recess, wherein at least an accessible portion of the cable connector is arranged in the recess. The wall portion forming a recess may also provide longer paths for potential, undesired surface currents from the cable connector along the outer surface of the encapsulation body.

A reliable engagement between a voltage divider assembly according to the present disclosure and a tap cable may be facilitated by providing, along with a voltage divider assembly as described herein, a cable plug that is adapted to be connected to a central conductor of a tap cable, and that is adapted to be engaged with the cable connector of the voltage divider assembly. The engagement between cable connector and cable plug may be particularly reliable if the cable connector and the cable plug are specifically designed to be engaged with each other. It appears to be advantageous to provide a voltage divider assembly with a cable connector, and, e.g. as a separate item, with a cable plug adapted to be engaged with the cable connector of the voltage divider assembly.

The cable connector and the cable plug may be specifically adapted to be engaged with each other, for example by the presence of one or more engagement elements in the cable connector, and the presence of one or more corresponding engagement elements in the cable plug, that facilitate mating and reliable engagement of the cable connector with the cable plug.

Optionally, a tap cable may be provided in addition, to which the cable plug can be connected. The cable plug may either be provided separately from the tap cable, or alternatively it may already be connected to a central conductor of the tap cable.

The present disclosure thus also provides a kit of parts for electrically connecting elements of a voltage-dividing sensor to a power conductor, the kit comprising a) a voltage divider assembly as described herein; b) a cable plug, connectable to a central conductor of a tap cable for conducting the voltage of the power conductor to the voltage divider assembly, the cable plug comprising an engagement element, specifically adapted for engaging with a corresponding engagement element of the cable connector of the voltage divider assembly; and c) optionally, a tap cable for conducting the voltage of the power conductor to the voltage divider assembly, the tap cable comprising a central conductor to which the cable plug can be, or is, connected.

In power networks, electrical power is often transmitted as two or—more commonly—three phases AC voltages. Each phase is transmitted in a separate MV/HV power conductor, e.g. a separate MV/HV power cable, termed "phase conductor" herein. In order to have a complete measurement of the voltage transmitted, it is desirable to measure the voltage of all phase conductors simultaneously.

This can be achieved, for example, by connecting each phase conductor to a separate voltage divider assembly as described herein. However, the corresponding phase conductors of a power line are usually routed in close proximity to each other. This allows the respective voltage divider assemblies to be arranged close to each other, too. It may therefore be advantageous to accommodate these separate voltage divider assemblies in a single encapsulation body, or at least accommodate the pluralities of discrete impedance elements of the separate voltage divider assemblies in a single encapsulation body. Except for its size, the one single encapsulation body can be very similar to the encapsulation body described above for encapsulating a single voltage divider assembly.

The present disclosure therefore also provides a voltage divider block comprising a first voltage divider assembly as described herein, and a second voltage divider assembly as described herein, wherein the plurality of discrete impedance elements of the first voltage divider assembly and the plurality of discrete impedance elements of the second voltage divider assembly are embedded in one single solid, electrically insulating encapsulation body. In certain embodiments, the one single encapsulation body is a homogenous encapsulation body.

Where power is transmitted in three phases AC voltage, an alternative voltage divider block may comprise a first voltage divider assembly as described herein, a second voltage divider assembly as described herein, and a third voltage divider assembly as described herein, wherein the plurality of discrete impedance elements of the first voltage divider assembly, the plurality of discrete impedance elements of the second voltage divider assembly, and the plurality of discrete impedance elements of the third voltage divider assembly are embedded in one single solid, electrically insulating encapsulation body.

The present disclosure also provides a power network of a national grid, comprising a MV/HV power conductor, a voltage divider assembly as described herein, and a tap cable conducting the voltage of the power conductor to the voltage divider assembly and comprising a cable plug at one of its ends, the cable plug being engaged with the cable connector of the voltage divider assembly.

Figure 2:
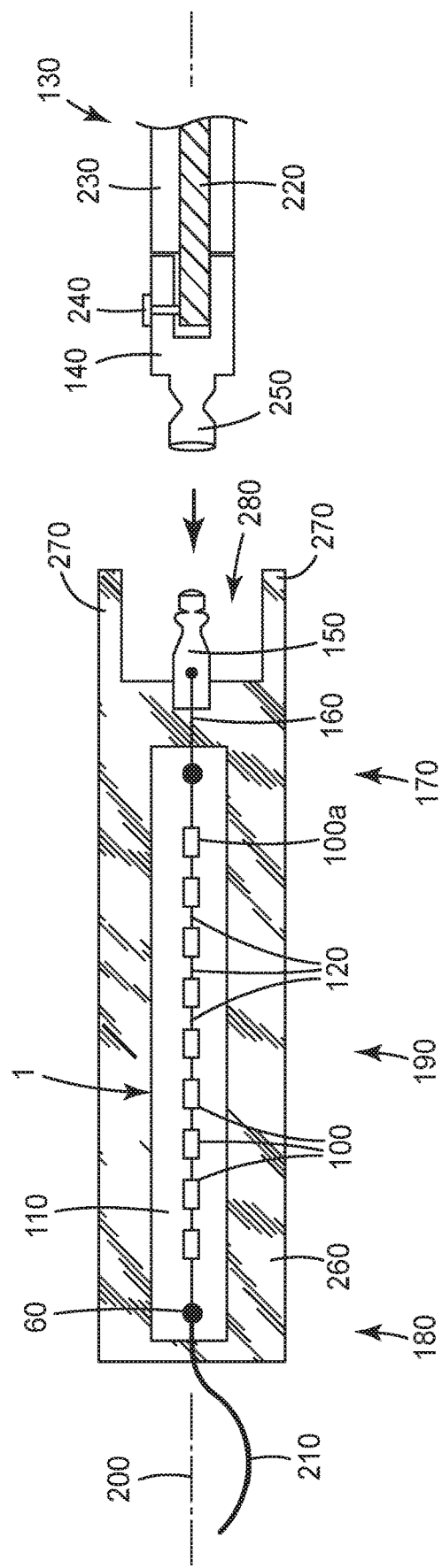
Figure 3:
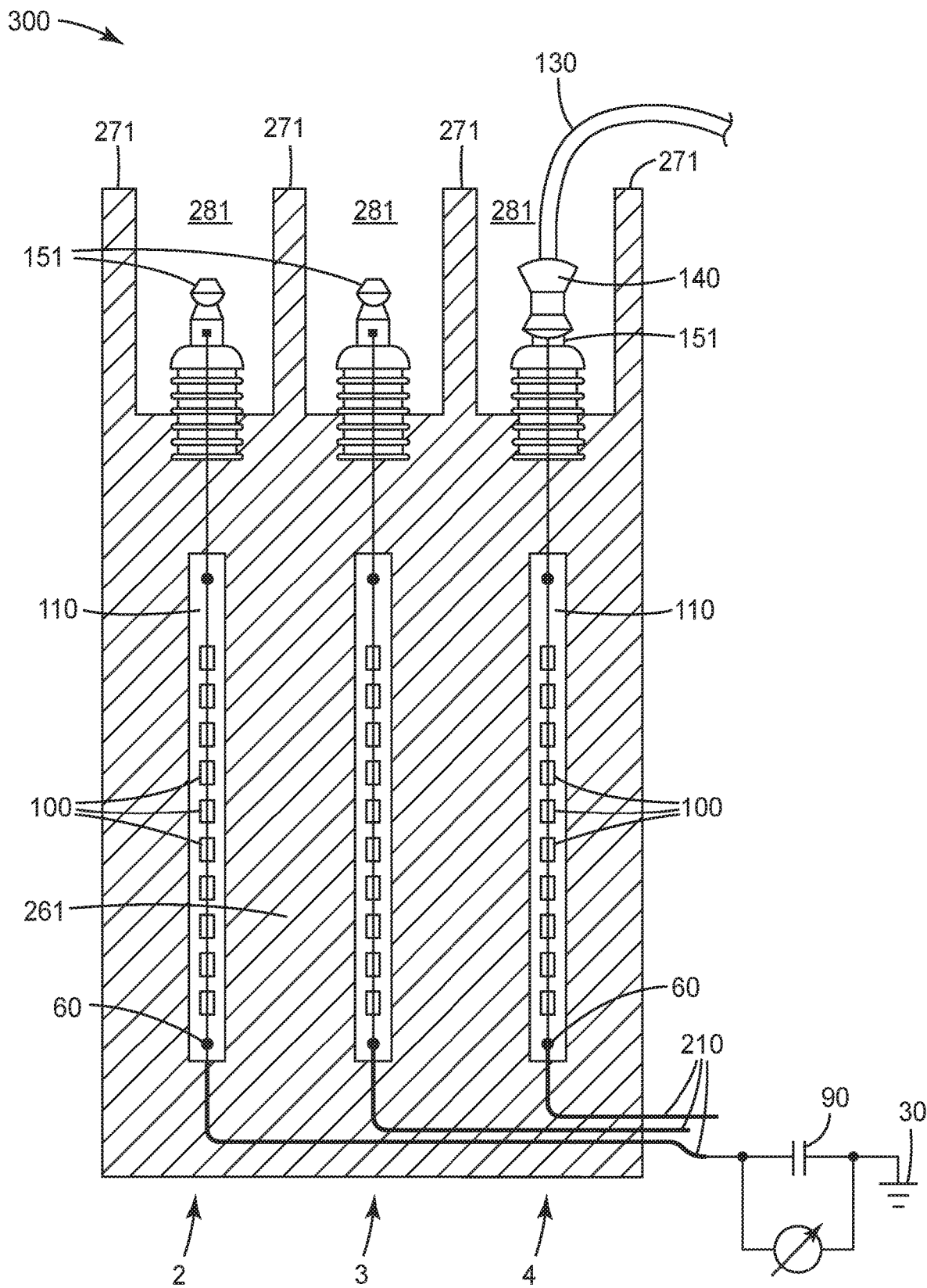
Figure 4:
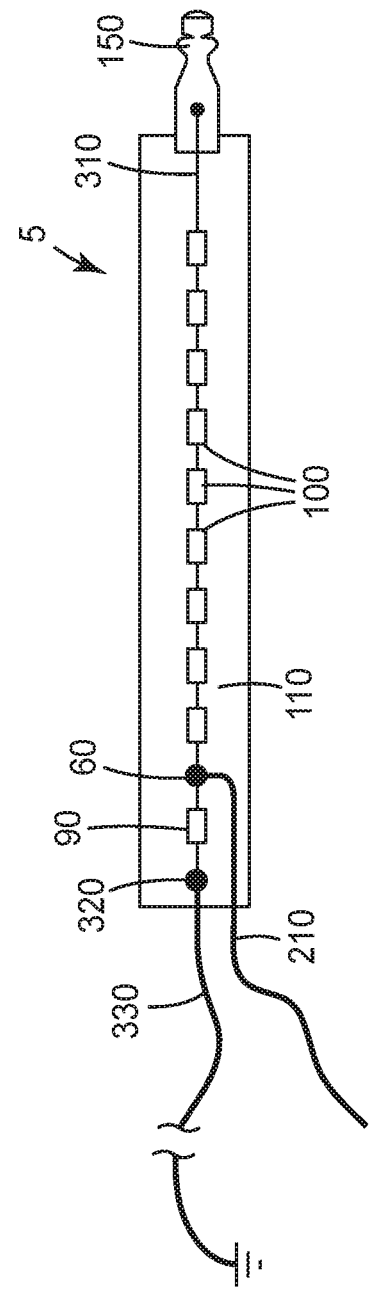

The invention will now be described in more detail with reference to the following Figures exemplifying particular embodiments of the invention:

FIG. 1 Circuit diagram of a known voltage divider;

FIG. 2 Plan view of a first voltage divider assembly according to the present disclosure and a tap cable;

FIG. 3 Sectional view of a voltage divider block comprising three voltage divider assemblies according to the present disclosure, encapsulated in a single encapsulation body; and FIG. 4 Plan view of a fifth voltage divider assembly according to the present disclosure, without encapsulation.

The circuit diagram of FIG. 1 illustrates the principle of a voltage divider for sensing a voltage of a MV/HV power conductor 10, such as a bus bar in a MV/HV switchgear or a central conductor of a MV/HV power cable in a national grid. This principle can be used in voltage divider assemblies according to the present disclosure. When in use, the power conductor 10 is at a medium or high voltage of between 1 kV and 100 kV with respect to electrical ground, the "network voltage", and conducts alternating currents (AC) of tens of amperes up to hundreds of amperes.

The voltage divider 20 comprises a high-voltage cable side 40, a low-voltage ground side 50, a signal contact 60 and a grounding contact 35 for connection to electrical ground 30. For sensing the voltage of the power conductor 10, the cable side 40 is conductively connected to the power conductor 10, and the ground side 50 is connected to electrical ground 30. A divided voltage can be picked up at the signal contact 60 between the cable side 40 and the ground side 50. The divided voltage is proportional to the voltage of the power conductor 10, with the proportionality factor being the dividing ratio of the voltage divider 20. By measuring the divided voltage, this proportionality is used for sensing the voltage of the power conductor 10.

The voltage divider 20 shown in FIG. 1 is a capacitive voltage divider 20 for sensing alternating (AC) voltages. Its cable side 40 consists of four dividing capacitors 70, electrically connected in series between a high-voltage contact 80 and a signal contact 60 of the voltage divider 20. The signal contact 60 provides access to the divided voltage. Each of the four dividing capacitors 70 has a capacitance of 80 picofarad (pF), so that they provide a combined capacitance of 20 pF. Alternative voltage dividers can be built using other types of discrete impedance elements, such as resistors or inductances, instead of capacitors.

The ground side 50 of the voltage divider 20 comprises a single capacitor 90, referred to as the low-voltage capacitor 90. It is connected between the signal contact 60 and electrical ground 30. The low-voltage capacitor 90 has a capacitance of 200 nF (nanofarad).

The dividing ratio of the voltage divider 20 is about 1:10 000. If the power conductor 10 is at 50 kV, the output voltage of the voltage divider 20 at the signal contact 60 is about 5 V. Voltages of that magnitude can be processed by standard electronic circuitry.

The large voltage drop across the four dividing capacitors 70 from 50 kV to 5 V on the cable side 40 of the voltage divider 20 requires specific mechanical and electrical designs, as will be explained below.

FIG. 2 illustrates, in a plan view, partially a sectional view, a first voltage divider assembly 1 according to the present disclosure, embedded in an encapsulation body, and an end of a tap cable. The voltage divider assembly 1 is for use in a voltage-dividing sensor for sensing a voltage of a MV/HV power conductor (not shown), i.e. for voltages of 1 kV or higher. In a voltage divider 20 as shown in FIG. 1, the voltage divider assembly 1 forms at least the cable side 40 of the voltage divider 20.

The voltage divider assembly 1 comprises a plurality of discrete impedance elements 100, which are nine discrete capacitors 100 in the embodiment shown in FIG. 1. These capacitors 100 are mounted on a printed circuit board ("PCB") 110 and are electrically connected in series with each other via conductive traces 120 on the surface of the PCB 110. The capacitors 100 can be said to form a "capacitor chain". Due to their electrical arrangement in series, these capacitors 100 can form a cable side 40 of a voltage divider 20 in the voltage-dividing sensor for sensing the high voltage of a power conductor. The ground side 50 of the voltage divider 20 is not comprised in the voltage divider assembly 1. In alternative embodiments, however, one or more further capacitors may be arranged on the PCB 110 for forming the ground side 50 of the voltage divider 20.

The high voltage of the power conductor is conducted to the voltage divider assembly 1 by a tap cable 130 which can be mechanically engaged, via a cable plug 140, with a cable connector 150 at an end portion of the voltage divider assembly 1. The cable connector 150 is electrically conductive and electrically connected with the rightmost (in FIG. 2) discrete capacitor 100a via a wire 160 and a conductive trace 120 on the PCB 110.

The voltage divider assembly 1 has an elongate shape, defining a first end portion 170, an opposed second end portion 180, and a middle portion 190 connecting the end portions 170, 180 with each other. The elongate shape of the voltage divider assembly 1 defines a length direction 200 of the voltage divider assembly 1. The capacitors 100 are linearly arranged in a straight row, the direction of the row being parallel to the length direction 200 of the voltage divider assembly 1.

The voltage of the power conductor is divided by the plurality of discrete capacitors 100, so that a divided voltage, the "signal voltage", can be picked up at a signal contact 60, which is also arranged on the PCB 110, and electrically arranged between the cable side 40 and the ground side 50 of the voltage divider 20. The signal contact 60, in turn, is connected to a signal wire 210 which conducts the signal voltage of the signal contact 60 to the outside of the voltage divider assembly 1. Outside the voltage divider assembly 1, one or more impedance elements (not shown) form the ground side 50 of the voltage divider 20. They are electrically arranged between the signal contact 60 and ground 30. The voltage between the signal wire 210 and ground 30 is proportional to the voltage of the power conductor versus ground. with the proportionality factor being the dividing ratio of the voltage divider 20, i.e. the ratio of the impedance of the cable side 40 and the impedance of the ground side 50 of the voltage divider 20. By measuring the divided voltage, this proportionality is used for sensing the voltage of the power conductor.

Looking at the tap cable 130, the tap cable 130 has a central conductor 220 and an insulation layer 230 surrounding the central conductor 220. The tap cable 130 has more layers, e.g. a dielectric layer and an outer sheath, which are not shown for the sake of clarity.

The tap cable 130 conducts the high voltage of the power conductor to the voltage divider assembly 1. At the end of the tap cable 130, the tap cable 130 is stripped to expose the central conductor 220. A cable plug 140 of conductive metal is attached to the end of the central conductor 220 by virtue of a fastening screw 240. The cable plug 140 comprises on its rear end a fastening mechanism for securing the cable plug 140 to an end of a central conductor 220, and on its front end an engagement element 250 for reliable engagement with the cable connector 150 of the voltage divider assembly 1. The engagement element 250 is specifically designed to engage with the cable connector 150, and the cable connector 150 is specifically designed to engage with the engagement element 250. These elements are designed to mate with each other like a plug mates with a corresponding socket. By engaging the cable connector 150 with the cable plug 140, an electrical connection is established between the central conductor 220 of the tap cable 130 and the discrete capacitor 100a at the "high-voltage" end of the chain of capacitors 100.

While the cable connector 150 connects the voltage divider assembly 1 to the tap cable 130, the cable connector 150 is on a voltage of typically several tens of kilovolts. At the opposite end of the voltage divider assembly 1, the signal contact 60 is normally on a voltage of between 1V and 100V. Therefore, a considerable voltage difference exists between the opposed end portions 170, 180 of the voltage divider assembly 1. The voltage drop from one end to the other occurs stepwise from one discrete capacitor 100 to the next. However, a risk exists that the high voltage of the cable connector 150 discharges, through air or through gas in a switchgear, directly to an element on lower voltage, e.g. to the signal contact 60 or to one of the capacitors 100 closer to the lower-voltage end of the capacitor chain.

In order to reduce the risk of such discharges, the chain of capacitors 100, a portion of the cable connector 150 and the PCB 110 are embedded in an encapsulating body 260 of essentially cylindrical shape, made from an electrically insulating casting resin comprising epoxy resin. Before solidifying, while still liquid, the resin was cast around the PCB 110, the discrete capacitors 100 and a portion of the cable connector 150, and was then hardened by curing. The resulting solid encapsulation body 260 is in contact with the surfaces of the PCB 110 and of the capacitors 100. The encapsulating body 260 therefore contains essentially no air pockets next to the PCB 110 and the capacitors 100, thus reducing the risk of electrical discharges and failure of the voltage divider assembly 1 when in use with high voltages. Also, the encapsulating body 260 seals the embedded elements against ingress of water from outside the voltage divider assembly 1.

The encapsulating body 260 is transparent, thereby allowing visual inspection of the discrete capacitors 100 and of the PCB 110. The encapsulating body 260 is solid and rigid and thus provides mechanical stability to the voltage divider assembly 1.

The cable connector 150 is partially embedded in the encapsulating body 260 such that the encapsulating body 260 does not prevent engagement of the cable connector 150 with the cable plug 140 of the tap cable 130 and leaves a portion of the cable connector 150 accessible for engagement with the cable plug 140. The encapsulating body 260 comprises a wall portion 270 forming a recess 280, in which recess 280 the accessible portion of the cable connector 150 is arranged. The protruding wall portion 270 provides for mechanical protection of the accessible portion of the cable connector 150 and for a longer paths for potential, undesired surface currents along the outer surface of the encapsulation body 260.

Power networks often transmit electrical power in an AC three-phase configuration, where each phase is transmitted by a separate power conductor. For accurate monitoring, the alternating voltage of each of these three power conductors is sensed by a separate voltage-dividing sensor, each of which may comprise a voltage-divider assembly according to the present disclosure. Such a configuration is illustrated in the sketched sectional view, combined with elements of circuit diagrams, of FIG. 3.

FIG. 3 shows a voltage divider block 300 comprising a second voltage divider assembly 2, a third voltage divider assembly 3, and a fourth voltage divider assembly 4, all according to the present disclosure. The second voltage divider assembly 2, the third voltage divider assembly 3 and the fourth voltage divider assembly 4 are identical to each other, and similar to the first voltage divider assembly 1 illustrated in FIG. 2, except for the shape of the cable connectors 151.

The three elongate voltage divider assemblies 2, 3, 4 are arranged with their length directions parallel to each other. The discrete capacitors 100 and the PCBs 110 on which they are arranged, as well as portions of their respective cable connectors 151, are embedded in one single electrically insulating encapsulation body 261. The encapsulation body 261 has a brick shape, but is otherwise similar to the encapsulation body 260 shown in FIG. 2. The encapsulation body 261 is made from an electrically insulating casting resin comprising epoxy resin. Before solidifying, while still liquid, the resin was cast around the PCBs 110 with the discrete capacitors 100 on them, and a portion of the respective cable connectors 151, and was then hardened by curing. The resulting solid encapsulation body 261 is in contact with the surfaces of the PCB 110 and of the capacitors 100.

The encapsulating body 261 comprises wall portions 271 forming three cylindrical recesses 281, in which recesses 281 the accessible portions of the respective cable connectors 151 are arranged. Again, the protruding wall portions 271 provide for mechanical protection of the accessible portions of the respective cable connectors 151 and for a longer paths for surface currents along the outer surface of the encapsulation body 261.

Each of the three voltage divider assemblies 2, 3, 4 comprises a respective signal wire 210, connected to the respective signal contact 60 of each voltage divider assembly, which conducts the divided voltage, divided by the plurality of discrete capacitors 100, to outside the voltage divider block 300 towards an RTU box (not shown). In such an RTU box, the ground side 50 of the respective voltage dividers 20 is provided to form a complete a voltage divider 20 for each of the three voltage divider assemblies 2, 3, 4. This ground side 50 with the low-voltage capacitor 90 and its connection to ground 30 is only shown for the second voltage divider assembly 2. However, each of the three voltage dividers 20 is part of a voltage-dividing sensor for sensing a voltage of the respective MV/HV power conductor to which the associated voltage divider assembly 2, 3, 4 is connected via a tap cable 130.

A tap cable 130 is only connected to the fourth (i.e. rightmost, in FIG. 3) voltage divider assembly 4. The cable plug 140 at the end of this tap cable 130 is engaged with the cable connector 151 of the fourth voltage divider assembly 4. The other end of the tap cable 130 is connected to the MV/HV power conductor (not shown) and can thus conduct the voltage of the power conductor to the fourth voltage divider assembly 4. In use, all three voltage divider assemblies 2, 3, 4 will be connected to respective ends of three respective tap cables 130, which conduct the three phases of AC voltage of three associated power conductors to the three voltage divider assemblies 2, 3, 4 of the voltage divider block 300, so that the voltage of all three phases can be sensed.

FIG. 4 illustrates, in a sketched plan view, a fifth voltage divider assembly 5 according to the present disclosure. It is similar to the first voltage divider assembly 1, except for the features described in the following.

Firstly, the fifth voltage divider assembly 5 is not encapsulated. The fifth voltage divider assembly 5 may be usable, for example, in environmentally benign, non-aggressive scenarios, and/or for sensing a voltage of a MV power conductor on a lower voltage, e.g. slightly above 1 kV. The voltage divider assembly 5 may also be useful in gas-insulated switchgears, where insulation is provided by a gas, and the voltage divider assembly is not required to provide its own insulation to further reduce the risk of discharges.

Secondly, the cable connector 150 is attached directly to the PCB 110. The cable connector 150 is electrically connected to the chain of discrete capacitors 100 by a conductive trace 310 on the surface of the PCB 110.

Thirdly, a low-voltage capacitor 90 and a grounding contact 320 are arranged on the PCB 110. Thereby, all electrical elements of the voltage divider 20 are arranged on the PCB 110: The chain of discrete capacitors 100 forms the cable side 40 of the voltage divider 20, and the low-voltage capacitor 90 forms the ground side 50. The signal contact 60 is arranged on the PCB 110 electrically between the cable side 40 and the ground side 50.

A signal wire 210 and a grounding wire 330, connected to the grounding contact 320, provide the signal voltage and electrical ground towards an RTU box (not shown) where the signal voltage is determined with respect to ground, thereby sensing the voltage of the power conductor to which the voltage divider assembly 5 is connected via its cable connector 150.

The invention claimed is:

1. Voltage divider assembly operable in a voltage-dividing sensor for sensing a voltage of a MV/HV power conductor in a power network of a national grid, the voltage divider assembly comprising:
   a) a plurality of discrete impedance elements, electrically connected in series with each other and operable as a cable side of the voltage-dividing sensor;
   b) a cable connector for mechanical engagement with a cable plug at an end of a tap cable conducting the voltage of the power conductor to the voltage divider assembly,
   wherein the cable connector comprises a conductive portion, electrically connected with one discrete impedance element of the plurality of discrete impedance elements, and electrically connectable to the cable plug by engagement of the cable plug with the cable connector, wherein the cable connector comprises a shape specifically configured for mechanical engagement with a corresponding, matching tailored cable plug.

2. Voltage divider assembly according to claim 1, having an elongate shape defining a length direction of the voltage divider assembly, wherein the plurality of discrete impedance elements is arranged linearly in a straight row defining a long direction, wherein the long direction of the row is parallel, within an angle of +/−15°, to the length direction of the voltage divider assembly.

3. Voltage divider assembly according to claim 1, having an elongate shape defining a length direction of the voltage divider assembly, a first end portion, an opposed second end portion and a middle portion, connecting the first end portion with the second end portion of the voltage divider assembly, wherein the cable connector is arranged at the first end portion.

4. Voltage divider assembly according to claim 3, wherein the geometric extension of the voltage divider assembly, measured linearly between its opposed end portions and including the end portions, is 10 cm or greater, 15 cm or greater, or 20 cm or greater.

5. Voltage divider assembly according to claim 1, wherein the plurality of discrete impedance elements is arranged on a printed circuit board.

6. Voltage divider assembly according to claim 5, wherein the cable connector is attached to printed circuit board.

7. Voltage divider assembly according to claim 1, wherein the plurality of discrete impedance elements comprises ten or more discrete impedance elements.

8. Voltage divider assembly according claim 1, wherein the cable connector is adapted for releasable mechanical engagement with a cable plug at an end of a tap cable conducting the voltage of the power conductor to the voltage divider assembly.

9. Voltage divider assembly according to claim 1, further comprising a signal wire for making a voltage divided by the plurality of discrete impedance elements, and indicative of the voltage of the power conductor, available for measurement outside the voltage divider assembly.

10. Voltage divider assembly according to claim 1, wherein the plurality of discrete impedance elements is embedded in a solid, electrically insulating encapsulation body.

11. Voltage divider assembly according to claim 10, wherein the encapsulation body encapsulates a first portion of the cable connector, and leaves a second portion of the cable connector accessible for engagement with a cable plug of a tap cable.

12. Voltage divider assembly according to claim 10, wherein the encapsulation body comprises a wall portion forming a recess, and wherein at least an accessible portion of the cable connector is arranged in the recess.

13. Kit of parts for electrically connecting elements of a voltage-dividing sensor to a power conductor, the kit comprising:

a) a voltage divider assembly according to claim 1; and
b) a cable plug, connectable to a central conductor of a tap cable for conducting the voltage of the power conductor to the voltage divider assembly, the cable plug comprising an engagement element, specifically adapted for engaging with a corresponding engagement element of the cable connector of the voltage divider assembly.

14. Voltage divider block comprising
a first voltage divider assembly according to claim 1 and
a second voltage divider assembly according to claim 1,
wherein the plurality of discrete impedance elements of the first voltage divider assembly and the plurality of discrete impedance elements of the second voltage divider assembly are embedded in one single solid, electrically insulating encapsulation body.

15. Power network of a national grid, comprising a MV/HV power conductor, a voltage divider assembly according to claim 1, and a tap cable conducting the voltage of the power conductor to the voltage divider assembly and comprising a cable plug at one of its ends, the cable plug being engaged with the cable connector of the voltage divider assembly.

16. The kit of parts according to claim 13, further comprising:
a tap cable for conducting the voltage of the power conductor to the voltage divider assembly, the tap cable comprising a central conductor to which the cable plug is connectable.

* * * * *